United States Patent
Gailhard et al.

(10) Patent No.: US 6,680,633 B2
(45) Date of Patent: Jan. 20, 2004

(54) SMALL-SIZED ANALOG GENERATOR PRODUCING CLOCK SIGNALS

(75) Inventors: Bruno Gailhard, Trets (FR); Olivier Ferrand, Puyloubier (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/013,316

(22) Filed: Oct. 30, 2001

(65) Prior Publication Data

US 2002/0089360 A1 Jul. 11, 2002

(30) Foreign Application Priority Data

Oct. 30, 2000 (FR) .............................. 00 13901

(51) Int. Cl.[7] .............................................. H03L 7/06
(52) U.S. Cl. ........................................ 327/156; 327/160
(58) Field of Search ........................ 327/94, 156, 157, 327/159, 161

(56) References Cited

U.S. PATENT DOCUMENTS

| 5,212,434 A | * | 5/1993 | Hsieh | 318/603 |
| 5,502,411 A | | 3/1996 | Matsuki et al. | 327/156 |
| 5,875,104 A | * | 2/1999 | Prager | 363/65 |

FOREIGN PATENT DOCUMENTS

| EP | 0416840 | 3/1991 | H03L/7/089 |
| EP | 0564377 | 10/1993 | H03L/7/089 |

* cited by examiner

Primary Examiner—Dinh T. Le
(74) Attorney, Agent, or Firm—Lisa K. Jorgenson; Allen, Dyer, Doppelt, Milbrath & Gilchrist, P.A.

(57) ABSTRACT

A generator producing a clock signal whose frequency depends on a control voltage includes a comparator for comparing a period of the clock signal with a desired period, and for providing at least one first control signal based upon the comparison. The generator includes a sampler circuit for sampling the first control signal, and for producing a first sampled control signal. The generator also includes a voltage generator for providing the variable control voltage as a function of the first sampled control signal.

28 Claims, 2 Drawing Sheets

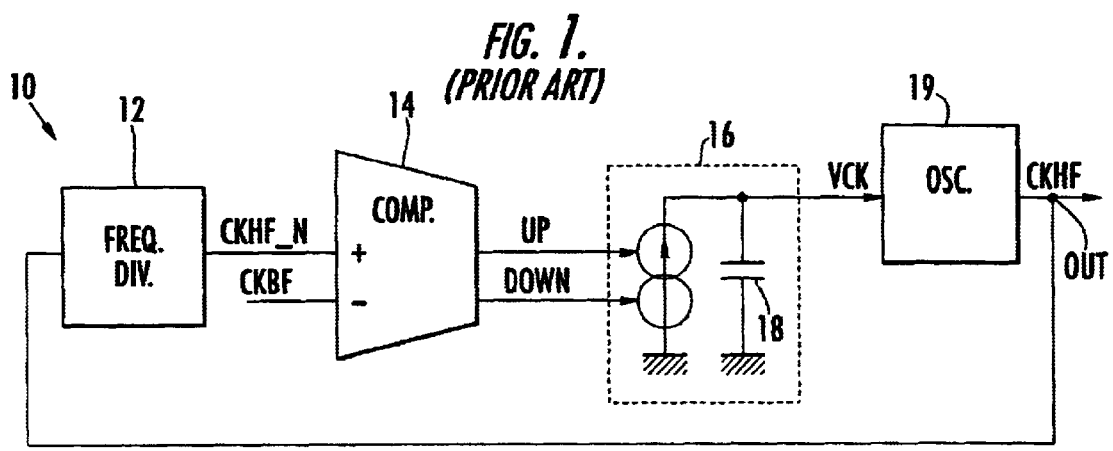
FIG. 1. (PRIOR ART)
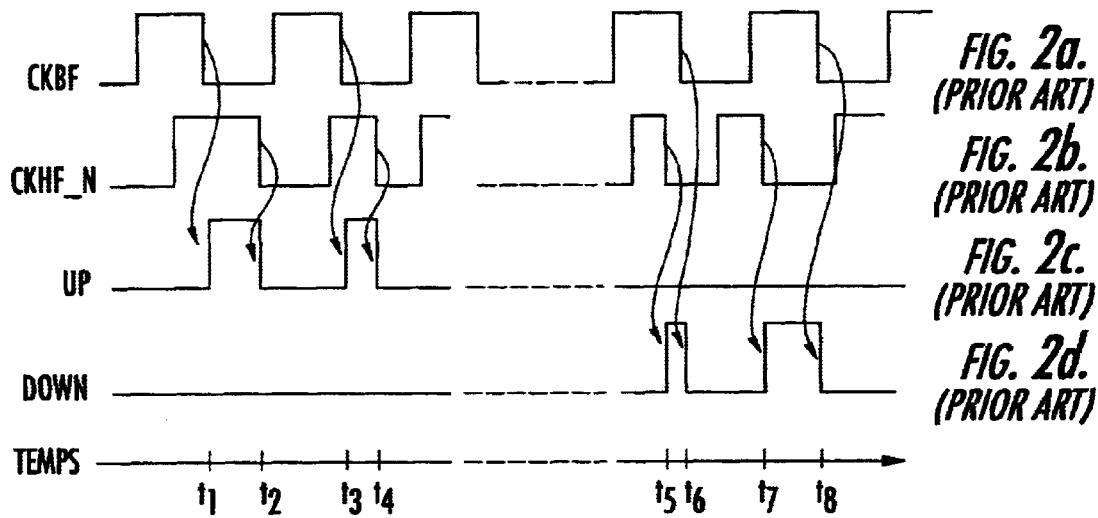
FIG. 2a. (PRIOR ART)
FIG. 2b. (PRIOR ART)
FIG. 2c. (PRIOR ART)
FIG. 2d. (PRIOR ART)
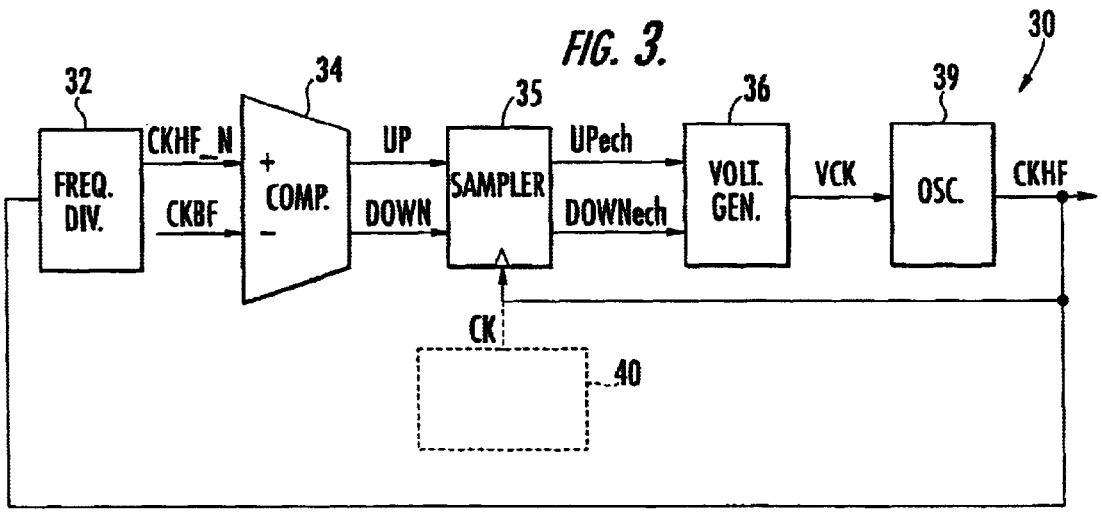
FIG. 3.

SMALL-SIZED ANALOG GENERATOR PRODUCING CLOCK SIGNALS

FIELD OF THE INVENTION

The invention relates to phase-locked loop type clock-signal generators that produce a high-frequency clock signal from a low-frequency clock signal. Among these generators, the invention relates more specifically to those using an analog oscillator producing clock signals whose frequency is proportional to a control voltage.

BACKGROUND OF THE INVENTION

A prior art generator 10 as shown in FIG. 1 comprises a frequency divider 12, a phase comparator 14, a voltage generator 16 and an oscillator 19 that are series connected. An output OUT of the oscillator 19 is connected to an input of the frequency divider 12. The generator 10 provides a high-frequency clock signal CKHF (f=FHF) as a function of a reference low-frequency signal CKBF (f=FBF).

The frequency divider 12 receives the high-frequency clock signal CKHF and provides a low-frequency signal CKHF_N that is an image of the signal CKHF, with a frequency equal to f=FHF/N. N is an integer whose value is chosen as a function of the desired frequency FHF0 for the high-frequency clock signal CKHF, and of the frequency FBF of the reference signal CKBF used: N=FHF0/FBF.

The phase comparator 14 has a positive input and a negative input. The signals CKHF_N and CKBF are respectively applied to these inputs. When the signals CKHF_N and CKBF are equal to a 1, the phase comparator 14 determines the phase difference between these signals. This is done by comparing the relative position of the trailing edges of the clock signals CKHF_N and CKBF. The comparator then produces two logic control signals UP, DOWN as a function of the result of the comparison.

The signals UP, DOWN have the following characteristics. If a trailing edge of CKBF is detected first (instants t1 and t3 in FIGS. 2a–2d), with the signals CKHF_N and CKBF being previously at a 1, CKBF has a phase lead over CKHF_N. The comparator 14 then gives an active signal UP which, for example, takes the logic value 1. UP is then deactivated on the next trailing edge of the CKHF_N (instants t2 and t4 in FIGS. 2a–2d).

If a trailing edge of CKHF_N is detected first (instants t5 and t7 in FIGS. 2a–2d), with the signals CKHF_N and CKBF being previously at a 1, CKBF has a phase delay with respect to CKHF_N. The comparator 14 then gives an active signal DOWN which, for example, takes the logic value 1. DOWN is then deactivated on the next trailing edge of CKBF (instants t6 and t8 in FIGS. 2a–2d). Otherwise, the signals UP and DOWN remain constant, active or inactive as the case may be.

The voltage generator 16 receives the signals UP and DOWN and gives a variable control voltage VCK. The voltage generator 16 comprises a current generator 17 which gives a current ICH from the control signals UP and DOWN. This current ICH has the following characteristics. ICH=+I0 if UP is active, for example, equal to 1. ICH=−I0 if DOWN is active, for example, equal to 1. ICH=0 if UP and DOWN are inactive.

The current ICH is used to charge or discharge a capacitor 18. When ICH=+I0, the capacitor 18 is charged and the voltage VCK at its terminals increases linearly in a slope proportional to I0. Conversely, when ICH=−I0, the capacitor 18 is discharged and the control voltage VCK at its terminals consequently diminishes linearly in a slope proportional to −I0. Naturally, if ICH is zero, the voltage VCK is kept constant.

The variation ΔVCK of the voltage VCK, in terms of absolute value is given by the relationship ΔVCK=I0*ΔT0/C0, where C0 is the capacitance of the capacitor 18 and ΔT0 is the duration of a pulse of one of the control signals UP or DOWN.

The pulses UP, DOWN have a maximum duration ΔT0 max when the signal CKHF has a frequency very distant from its borderline value FHF0. This is especially so when the generator 10 is started up. The maximum duration of a pulse UP, DOWN is in the range of the period PBF: ΔT0 max≈N*PHF0.

The oscillator 19 gives the high-frequency clock signal CKHF, whose frequency FHF is proportional to the control voltage VCK. When the control voltage VCK rises, the frequency FHF of the signal CKHF rises, and vice versa. The oscillator 19 has, for example, a looped chain of inverters, made up of an odd number of identical, series connected inverters. The signal CKHF is produced at an output of the last inverter which is connected to an input of the first inverter of the chain. The period PHF of the signal CKHF obtained is directly proportional to the switching time in the inverters which is itself modulated as a function of the control voltage VCK.

The general functioning of the clock signal generator 10 is as follows. If a trailing edge of CKBF is detected first (instants t1 and t3 in FIGS. 2a–2d), with the signals CKHF_N, CKBF being previously at a 1, CKBF has a phase lead over CKHF_N. It is estimated in this case that the frequency of the CKHF$_{13}$ N is lower than that of CKBF, namely that the frequency of CKHF is lower than the desired value FHF0=N*FBF. The comparator 14 then gives an active signal UP, the control voltage VCK rises, as does the frequency of the clock signal CKHF. UP is then deactivated on the next trailing edge of CKHF_N (instants t2 and t4 in FIGS. 2a–2d). The duration of the signal UP applied is thus proportional to the phase difference between CKHF_N and CKBF.

Conversely, if a trailing edge of CKHF_N is detected first (instants t5 in t7 in FIGS. 2a–2d), with the signals CKHF_N and CKBF being previously at a 1, CKBF has a phase delay with respect to CKHF_N. In this case, it is estimated that the frequency of CKHF_N is higher than that of CKBF, namely that the frequency of CKHF is higher than the desired value FHF0=N*FBF. The comparator 14 then gives an active signal DOWN, and the control voltage VCK diminishes as does the frequency of the clock signal CKHF. DOWN is then deactivated on the next trailing edge of CKBF (instants t6 and t8 in FIGS. 2a–2d). The duration of the signal DOWN applied is thus proportional to the phase difference between the signals CKHF_N and CKBF.

When the generator 10 is powered on, the frequency FHF of the signal CKHF is very low. For example, it is equal to the frequency FBF of the reference signal CKBF. The frequency FHF will then vary as a function of the pulses UP, DOWN produced by the phase comparator. The frequency FHF will increase on an average because the pulses UP are more numerous and their duration is greater than that of the pulses DOWN. The frequency FHF will finally converge towards its borderline value FHF0. The variations ΔFHF of the frequency FHF are a function of the duration ΔUP, ΔDOWN, of the pulses UP, DOWN, which is itself proportional to the phase difference between the signals CKHF_N and CKBF. It may be recalled that the frequency of CKFH_N is equal to FHF/N.

The control voltage VCK must be limited in amplitude so as to have an acceptable value, especially for the elements forming the oscillator 19. When the generator 10 is started up, the frequency FHF is low, the period PHF is large and the duration of the pulses UP, DOWN is also large, i.e., close to its maximum value ΔVCKmax. ΔVCKmax is equal to about ICH*N*PHF0/C0. Consequently, to limit the maximum value ΔVCKmax of the variations in the control voltage VCK, especially when starting, it is necessary to choose a number N that is small or to increase the capacitance C0 of the capacitor C.

If the frequency of the reference signal CKBF is close to the desired frequency FHF0 for the clock signal CKHF, i.e., with N in the range of 10 to 50, it is possible to choose a capacitance C0 that is not excessively large and can be set up in the integrated circuit.

However, if the frequency of the reference signal is low, i.e., far lower than the frequency FHF0 desired for the clock signal CKHF, then the number N must necessarily be large, such as in the range of 200, and the capacitor C must have a high capacitance value to limit the variations ΔVCK and hence the maximum value of the control voltage VCK. A capacitor of this kind can no longer be integrated.

The overall precision of the generator 10 is also limited. The uncertainty with respect to the signal CKHF is directly proportional to the variation in the control voltage VCK when the frequency FHF is close to its borderline value FHF0. As shown above, this variation is in the range of ΔVCK=I0* T0/C0<I0*N*PHF/C0.

It would be advantageous to be able to use a very low frequency reference signal, in the range of 10 Hz to 50 kHz for example, particularly for cost reasons. A reference signal of this kind could be obtained from a particularly stable quartz crystal generator (FBF in the range of 32 kHz) or else from a national electrical power system, which provides a signal with a frequency of 50 Hz, for example, that is also stable. Other sources of low-frequency and low-cost reference signals may also be considered.

SUMMARY OF THE INVENTION

In view of the foregoing background, an object of the invention is to provide a phase-locked loop type of clock signal generator that produces very high frequency clock signals from very low frequency reference signals.

Another object of the invention is to provide a clock signal generator that is more precise than existing generators, namely a generator that produces a clock signal whose uncertainty with respect to the frequency (or period) is minimized.

These and other objects, advantages and features according to the invention are provided by a generator that produces a clock signal whose frequency depends on a control voltage, with the generator comprising a comparator for comparing the period of the clock signal with a desired period and for providing at least one first control signal as a function of the result of the comparison.

The generator also comprises a sampler to sample the first control signal and produce a first sampled control signal, and a voltage generator to give the variable control voltage as a function of the first sampled control signal. The variation (ΔVCK) of the control voltage (VCK) is limited by the duration of the first sampled signal.

Thus, with the invention, the duration of application of the first control signal is reduced by the application, to the voltage generator, of only the first sampled control signal, which is the image (in terms of duration) of the first control signal.

Since the duration of the first sampled control signal is far smaller than the duration of the first control signal, it is then possible to diminish the capacitance of the capacitor of the voltage source to the same extent, without increasing the variations in the control voltage, as shall be seen more clearly below. The size of the generator is thus reduced accordingly.

Furthermore, the total time during which the control signal is active remains proportional to the difference between the frequency of the clock signal and the desired frequency. This means that the variations in the frequency of the clock signal can be managed as earlier.

According to one mode of implementation, the sampler comprises a counter to count pulses of a sampling clock signal when it receives a validation signal, and to give a sampled signal when the number of pulses counted reaches a first predefined number M. The counter is reset when it reaches a second predefined number X. The sampler further includes a first logic gate comprising two inputs to which the sampled signal and the first control signal are applied. The first logic gate produces the sampled control signal.

The sampler of the invention has its rate set by the sampling signal, and it produces a sampled signal every X periods of the sampling signal. The capacitance of the capacitor of the voltage generator may be X times smaller than that of the circuit of FIG. 1.

According to another mode of implementation, the comparator comprises a second output to produce a second control signal representing the result of the comparison. The sampler also comprises a second logic gate comprising two inputs to receive the first and second control signals, and an output to produce the validation signal. The sampler also includes a third logic gate comprising two inputs to receive the sampled signal and the second control signal, and one output to produce a second sampled signal.

The sampling signal may be the clock signal. The sampling signal may also be produced by an oscillator. In this case, the period of the sampling signal is chosen to be smaller than that of the clock signal to increase the overall precision of the generator of the invention.

BRIEF DESCRIPTION OF THE DRAWINGS

The invention will be understood more clearly and other features and advantages will appear from the following description, made with reference to the appended drawings, of which:

FIG. 1 is a functional block diagram of a clock signal generator according to the prior art;

FIGS. 2a to 2d are timing diagrams of signals at different points within the generator illustrated in FIG. 1;

FIG. 3 is a functional block diagram of a generator according to the present invention;

DETAILED DESCRIPTION OF THE PREFERRED EMBODIMENTS

Figure 4A:
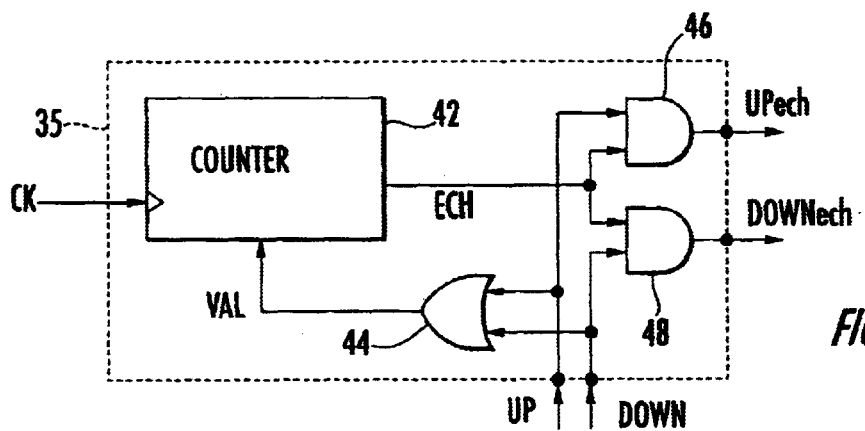
FIGS. 4a and 4b are schematic diagrams of selected elements within the generator illustrated in FIG. 3.

A clock signal generator 30 according to the invention comprises, as illustrated in FIG. 3, a frequency divider 32, a phase comparator 34, a sampler 35, a voltage generator 36 and an oscillator 39 that are series connected. An output OUT of the oscillator 39 is connected to an input of the frequency divider 32. At the output OUT, the generator 30 gives a high-frequency clock signal CKHF (f=FHF) as a function of a low-frequency reference clock signal CKBF (f=FBF).

The frequency divider 32 is identical to that of the circuit of FIG. 1 and operates similarly. The frequency divider 32 receives the high-frequency clock signal CKHF and it gives a low-frequency clock signal CKHF_N that is the image of the signal CKHF, with a frequency equal to f=FHF/N.

The phase comparator 14 is also identical to that of FIG. 1 and operates similarly. The phase comparator 14 comprises a positive input and a negative input, to which the signals CKHF_N and CKBF are applied respectively. When the signals CKHF_N and CKBF are equal to a 1, the phase comparator 14 determines the phase difference between the signals CKHF_N and CKBF. This is done by comparing the relative position of the trailing edges of the clock signals CKHF_N and CKBF.

The comparator then produces two logic control signals UP, DOWN as a function of the result of the comparison. UP is active (for example, equal to 1) if the signal CKBF has a phase lead with respect to the signal CKHF_N. Namely, if the frequency FHF of the signal CKHF is lower than the desired value FHF0. DOWN is active (for example, equal to 1) if the signal CKBF has a phase delay with respect to the signal CKHF_N. Namely, if the frequency FHF of the signal CKHF is higher than the desired value FHF0. Otherwise, UP and DOWN are inactive.

The sampler 35 comprises two data inputs to which there are applied the signals UP, DOWN, and one clock input connected to the output OUT of the oscillator 39 to receive the clock signal CKHF. The sampler 39 produces two control signals UPech, DOWNech having the following characteristics.

When UP is active, the signal UPech is produced in the form of an active pulse every X periods of the signal CKHF. The duration of a pulse of the signal UPech is equal to a period PHF of the signal CKHF. When DOWN is active, the signal DOWNech is produced in the form of an active pulse every X periods of the signal CKHF. The duration of a pulse of the signal DOWNech is equal to a period PHF of the signal CKHF. When the signals UP and DOWN are inactive, then the signals UPech and DOWNech are kept inactive.

An exemplary embodiment of the sampler 35 is shown in FIG. 4a, and includes a counter 42, and three logic gates 44, 46, 48. The counter 42 has a clock input and a validation input to which there are respectively applied the clock signal CKHF and a signal VAL. The counter 42 produces a signal ECH at an output terminal.

The counter operates as follows. When the validation signal VAL is active, for example, equal to 1, the counter 42 counts the leading edges of the clock signal CKHF. Whenever it reaches the value M, the counter 42 produces an active signal ECH. When it reaches the value M+1, the counter 42 deactivates the signal ECH and continues to count. Finally, when it reaches the value X, the counter 42 is reset at 0 and continues to count the leading edges of the signal CKHF. When the validation signal VAL is inactive, for example, equal to 0, the counter 42 is stopped and the signal ECH is kept inactive.

The counter 42 is made according to a known electronic diagram, and comprises a set of logic gates and flip-flop circuits. The counter 42 also comprises decoding means to give the signal ECH when the value M is reached, and resetting means to reset the counter when the value X is reached.

The logic gate 44, which is an OR type gate, has two inputs to which the signals UP, DOWN are applied. The gate 44 gives the signal VAL which has the following characteristics. VAL is active (equal to 1) if UP is active or if DOWN is active. Otherwise, VAL is inactive (equal to 0). The gate 46, which is an AND type gate, comprises two inputs to which the signals UP and ECH are applied. The gate 46 produces the signal UPech when the signal UP is active. The signal UPech corresponds to the sampled signal UP. The gate 48, which is an AND type gate, has two inputs to which the signals DOWN and ECH are applied. The gate 46 produces the signal DOWNech when DOWN is active. The signal DOWNech corresponds to the sampled signal DOWN.

Figure 5A:
FIGS. 5a to 5d are timing diagrams of signals at different points within the generator illustrated in FIG. 3.
Figure 5B:
Figure 5C:

Operation of the sampler 35 is summarized with reference to an example illustrated in FIGS. 5a to 5c. The signal CKHF oscillates at the period PHF. At the instant Δ1, the signal UP becomes active, as does the signal VAL. It is also assumed that M=1. At the instant Δ2, the counter 42 counts the first leading edge of CKHF after the activation of the signal Val. It produces an active signal ECH (for M=1) and continues to count the leading edges of CKHF. Since the signals UP, ECH are active, the signal UPech becomes active.

At the instant Δ3, during the next leading edge of CKHF, the signal ECH becomes inactive, as does UPech. At the instant Δ4, the counter returns to 1 after having reached the number X and produces an active signal ECH: UPech becomes active. At the instant Δ5, at the next leading edge of the signal CKHF, ECH and UPech are deactivated.

The voltage generator 36 is similar to that of FIG. 1. It receives the signals UPech, DOWNech, and it gives the variable control voltage VCK. The voltage generator 36 comprises a current source controlled by the signals UPech, DOWNech and produces a charging current ICH with the following characteristics. ICH=+I0 if UPech is active, for example, equal to 1. ICH=−I0 if DOWNech is active, for example, equal to 1. ICH=0 if UPech, DOWNech are inactive.

The current ICH is used to charge or discharge a capacitor C. When ICH=+I0 during a pulse UPech, the capacitor C is charged and the voltage VCK at its terminals rises linearly in a slope proportional to I0. Conversely, when ICH=−I0 during a pulse DOWNech, the capacitor C is discharged and the control voltage VCK at its terminals consequently diminishes linearly in a slope proportional to −I0. Naturally, if ICH is zero, the voltage VCK is kept constant.

For each pulse UPech, DOWNech, the variation ΔVCK of the voltage VCK is equal to ΔVCK=ICH*ΔTech/C1. C1 is the capacitance of the capacitor C and ΔTech is the duration of a pulse of one of the sampled control signals UPech, DOWNech. Since the signals UPech, DOWNech are sampled with the signal CKHF, ΔTech is equal to the period PHF of the signal CKHF.

Figure 5D:
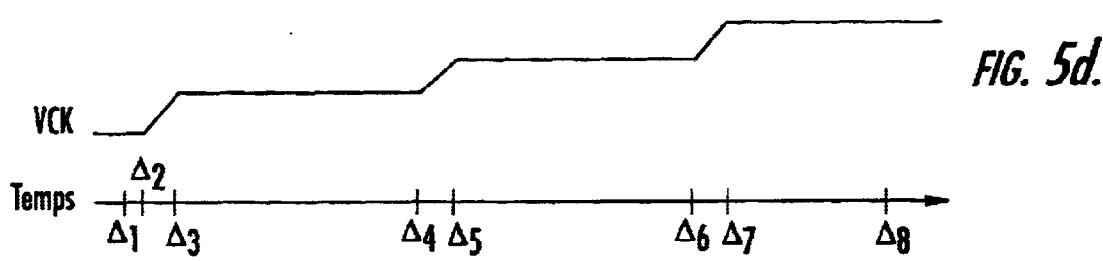

The variations in the control voltage VCK are shown in an example illustrated in FIG. 5d. Between the instants Δ1 and Δ8, the signal UP is active. During this time interval, the voltage VCK increases when UPech is active, between Δ2 and Δ3, Δ4 and Δ5, Δ6 and Δ7. Conversely, the voltage VCK is kept constant when UPech is inactive.

The oscillator 39 is identical to that of FIG. 1 and operates similarly. The oscillator 39 gives the clock signal CKHF whose frequency FHF is proportional to the control voltage VCK. When the control voltage VCK rises, the frequency of the signal CKHF rises, and vice versa.

The general functioning of the clock signal generator 30 according to the invention is as follows. The comparator 32 measures the difference between the period PHF of the clock signal CKHF and the desired period PHF0, and it gives a control signal UP or DOWN with a duration $\Delta T0$ as a function of the result of the comparison.

The sampler 35 samples the signal UP or DOWN that it receives and gives the corresponding signal UPech or DOWNech. When the signal UP or DOWN is active, the total duration of the pulses UPech or DOWNech is in the range of $\Delta T0/X$. During the time $\Delta T0$, the sampler 35 produces about N/X pulses UPech or DOWNech, each having a duration in the range of $\Delta Tech=PHF0/N$.

The voltage generator 36 then increases (or decreases) the voltage VCK as a function of the pulses UPech (or DOWNech) that it receives. Finally, the oscillator 39 gives the signal CKHF whose frequency is proportional to the control voltage VCK.

By sampling the signal UP by X, and applying only the sampled signal UPech (or DOWNech) to the voltage generator 36 instead of the signal UP (or DOWN), the time during which the control voltage VCK varies is approximately divided by X, as we have just seen. Consequently, it is possible to obtain a capacitance for the capacitor C that is X times smaller than in the prior art, without increasing the amplitude of the variations in the control voltage VCK.

Thus, with the invention the capacitance C1 of the capacitor C is X times smaller than in the prior art where X defines the sampling period of the control signals UP, DOWN. This is possible because, with the invention, the maximum total duration $\Delta Tech*N/X=PHF0/X$ during which the voltage VCK varies during a pulse UP, is X times smaller than the corresponding duration in the prior art.

Preferably, X is chosen so that, when the generator 30 converges on its position of equilibrium and when the period PHF is equal to its borderline value PHF0, allowing for the relative uncertainty P of the generator 30, then there is only one pulse UPech (or DOWNech) throughout the duration of a pulse UP (or DOWN).

When PHF is equal to PHF0 plus or minus P, then the duration of a signal UP is on the order of $N*PHF*P$, with the period of UPech being furthermore equal to $X*PHF$. X must therefore be chosen to be greater than $N*P$ so that there is a single pulse UPech. For example, if N=200, and P=0.05 (5%), then X can be chosen to be in the range of 10 to 15.

The relative uncertainty P with respect to the frequency FHF (or the period PHF) of the signal CKHF is directly proportional to the absolute uncertainty $\delta$VCK on the control voltage VCK. As seen above, the minimal variation of VCK (which defines $\delta$VCK) depends on the duration of a pulse UPech (or DOWNech), since a single pulse UPech (or DOWNech) appears when UP (or DOWN) is active: $\delta VCK=\delta I0*\delta T/C1$.

$\delta I0$ is the absolute uncertainty on the current I0 given by the current source 17. $\delta I0$ depends in particular on the disparity of the characteristics of the transistors which form the current source. This disparity is due to the manufacturing method used. $\delta I0$ also depends on the temperature at the circuit and its supply voltage. It is difficult to reduce $\delta I0$. $\delta T$ is the duration of a pulse UPech, i.e., a minimum time during which VCK varies when UP (or DOWN) is active. The absolute uncertainty $\delta$VCK (and therefore the relative uncertainty P on the frequency FHF) is thus limited by the duration of a pulse UPech.

The precision of the generator 30 of the invention can be increased by adding an oscillator 40 (FIG. 3) that gives a sampling signal CK whose frequency is higher than the frequency FHF0. The sampling signal CK is applied to the clock input of the sampler 35 and it sets the rate of operation of the counter. The signals UPech, DOWNech have a period equal to X*PCK. Naturally, if the circuit 40 is used, then the connection between the output of the oscillator 39 and the clock input of the sampler 35 is eliminated.

Figure 4B:
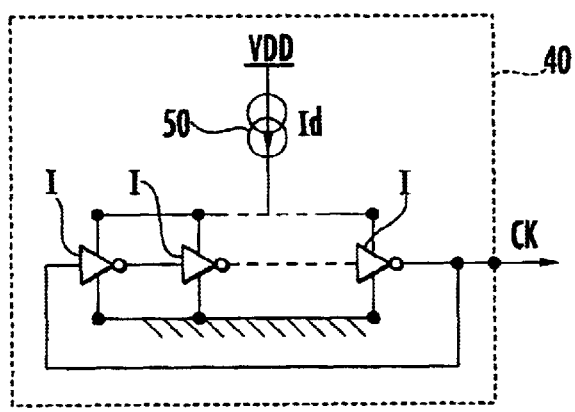

A simplified exemplary embodiment of the oscillator 40 is shown in FIG. 4b. It comprises an odd number NI of identical inverters I that are series connected. A data output of the first inverter is connected to a data input of the last inverter. This data output produces the signal CK.

Each inverter has two power supply inputs. The first power supply inputs of all the inverters are connected together to a ground of the circuit. The second power supply inputs of all the inverters are connected together to a terminal of a current source 50 whose other terminal is supplied with a voltage VDD.

The current source 50 produces a current Id that is shared and powers all the inverters I. The signal CK obtained at the output of the oscillator is a clock signal whose period is a function of the number NI of inverters and the upward and downward tripping times of the inverters. The tripping times of an inverter are themselves proportional to the current Id/NI that powers them. The oscillator 39 used in the generator 30 of the invention is similar to the oscillator 40. The oscillator 39 on the contrary has additional means to vary the current Id as a function of the control voltage VCK.

Preferably, a signal CK is chosen with a frequency FCK equal to A*FHF0, with A in the range of 10 to 50. Thus, the duration of a pulse UPech is divided by A as compared with the case where the oscillator 40 is not used.

When the period PHF is close to PHF0, the absolute uncertainty $\delta$VCK with respect to the control voltage (and therefore the uncertainty with respect to the frequency FHF or the period PHF) is divided by A as compared with the case where the oscillator 40 is not used. The precision of the generator 30 of the invention is therefore greatly increased by the addition of the oscillator 40.

The precision of the oscillator 40 is not a factor. If the frequency FCK is equal to 10*FHF0 (A=10), plus or minus 10%, then the uncertainty with respect to the frequency FHF is reduced by 9. This is a major improvement.

Modifications can easily be made to the circuit of FIG. 3. For example, the comparator 34 produces two control signals UP, DOWN. It is however possible to use a comparator producing a single logic control signal, which takes a first value when the frequency FHF is below its borderline value FHF0, and takes a second value when FHF is higher than FHF0. A comparator such as this is simpler to make. However, with a comparator such as this, the sampler 35, the current generator 36 and the oscillator 39 are always in operation.

That which is claimed is:

1. A signal generator comprising:
    a comparator for comparing a period of an output signal with a desired period, and for providing at least one first control signal based upon the comparison;
    a sampler circuit connected to said comparator for sampling the at least one first control signal, and for providing a first sampled control signal based upon the sampling;
    a voltage generator connected to said sampler circuit for providing a control voltage that varies as a function of the first sampled control signal, with the variation of the control voltage being limited by a duration of the first sampled control signal; and an oscillator having an input connected to said voltage generator for receiving the control voltage, and an output for providing the output signal having a frequency based upon the control voltage, the output also being directly connected to an input of said comparator for providing the output signal thereto.

2. A signal generator according to claim 1, wherein said sampler circuit comprises:

a counter for counting pulses of a sampling signal when a validation signal is received and for providing a sampled signal when a number of counted pulses reaches a first number, with said counter being reset when the number of counted pulses reaches a second number; and a first logic gate having a first input for receiving the sampled signal and a second input for receiving the at least one first control signal, and an output for providing the first sampled control signal.

3. A signal generator according to claim 2, wherein the at least one first control signal from said comparator includes a first control signal and a second control signal based upon the comparison; and wherein said sampler circuit further comprises:

a second logic gate having a first input for receiving the first control signal, a second input for receiving the second control signal, and an output for providing the validation signal; and a third logic gate having a first input for receiving receive the sampled signal, a second input for receiving the second control signal, and an output for providing a second sampled control signal.

4. A signal generator according to claim 2, wherein the sampling signal is the output signal.

5. A signal generator according to claim 2, further comprising a second oscillator connected to said sampler circuit for providing the sampling signal.

6. A signal generator according to claim 2, wherein a period of the sampling signal is less than or equal to the desired period of the output signal.

7. A signal generator comprising:

a comparator for comparing a period of an output signal with a desired period, and for providing a first control signal and a second control signal based upon the comparison;

a sampler circuit connected to said comparator for sampling the first and second control signals, said sampler circuit comprising a counter for counting pulses of a sampling signal when a validation signal is received and for providing a sampled signal when a number of counted pulses reaches a first number, a first logic gate having a first input for receiving the sampled signal and a second input for receiving the first control signal, and an output for providing a first sampled control signal, and a second logic gate having a first input for receiving the first control signal, a second input for receiving the second control signal, and an output for providing the validation signal;

a voltage generator connected to said sampler circuit for providing a control voltage that varies as a function of the first sampled control signal, with the variation of the control voltage being limited by a duration of the first sampled control signal; and an oscillator connected to said voltage generator for providing the output signal having a frequency based upon the control voltage.

8. A signal generator according to claim 7, wherein said counter is reset when the number of counted pulses reaches a second number.

9. A signal generator according to claim 7, wherein said sampler circuit further comprises a third logic gate having a first input for receiving the sampled signal, a second input for receiving the second control signal, and an output for providing a second sampled control signal.

10. A signal generator according to claim 7, wherein the sampling signal is the output signal.

11. A signal generator according to claim 7, further comprising a second oscillator connected to said sampler circuit for providing the sampling signal.

12. A signal generator according to claim 7, wherein a period of the sampling signal is less than or equal to the desired period of the output signal.

13. A signal generator according to claim 7, wherein said voltage generator comprises an analog voltage generator.

14. A signal generator according to claim 7, wherein said analog voltage generator comprises a current generator and a capacitor connected thereto.

15. A clock signal generator comprising:

a comparator for comparing a period of a clock signal with a desired period, and for providing at least one first control signal based upon the comparison;

a sampler circuit connected to said comparator for sampling the at least one first control signal, and for providing a first sampled control signal based upon the sample;

a voltage generator connected to said sampler circuit for providing a control voltage that varies as a function of the first sampled control signal, with the variation of the control voltage being limited by a duration of the first sampled control signal; and an oscillator having an input connected to said voltage generator for receiving the control voltage, and an output for providing the clock signal having a frequency based upon the control voltage, the output also being directly connected to an input of said comparator for providing the clock signal thereto.

16. A clock signal generator according to claim 15, wherein said sampler circuit comprises:

a counter for counting pulses of a sampling signal when a validation signal is received and for providing a sampled signal when a number of counted pulses reaches a first number, with said counter being reset when the number of counted pulses reaches a second number; and a first logic gate having a first input for receiving the sampled signal and a second input for receiving the at least one first control signal, and an output for providing the first sampled control signal.

17. A clock signal generator according to claim 16, wherein the at least one first control signal from said comparator includes a first control signal and a second control signal based upon the comparison; and wherein said sampler circuit further comprises:

a second logic gate having a first input for receiving the first control signal, a second input for receiving the second control signal, and an output for providing the validation signal; and a third logic gate having a first input for receiving receive the sampled signal, a second input for receiving the second control signal, and an output for providing a second sampled control signal.

18. A clock signal generator according to claim 16, wherein the sampling signal is the clock signal.

19. A clock signal generator according to claim 16, further comprising a second oscillator connected to said sampler circuit for providing the sampling signal.

20. A clock signal generator according to claim 16, wherein a period of the sampling signal is less than or equal to the desired period of the clock signal.

21. A clock signal generator according to claim 15, wherein said voltage generator comprises an analog voltage generator.

22. A clock signal generator according to claim 15, wherein said analog voltage generator comprises a current generator and a capacitor connected thereto.

23. A method for generating an output signal comprising:
    comparing in a comparator a period of the output signal with a desired period, and providing at least one first control signal based upon the comparison;
    sampling the at least one first control signal, and providing a first sampled control signal based upon the sample;
    providing a control voltage that varies as a function of the first sampled control signal, the variation of the control voltage is limited by a duration of the first sampled control signal; and
    providing the output signal at an output of an oscillator, the output signal having a frequency based upon the control voltage, and an output of the oscillator being directly connected to an input of the comparator for providing the output signal thereto.

24. A method according to claim 23, wherein sampling the at least one first control signal comprises:
    counting pulses of a sampling signal when a validation signal is received, and providing a sampled signal when a number of counted pulses reaches a first number; and
    performing a first logic function using a first logic gate having a first input for receiving the sampled signal and a second input for receiving the at least one first control signal, and an output for providing the first sampled control signal.

25. A method according to claim 24, wherein counting the pulses is performed using a counter; and further comprising resetting the counter when the number of counted pulses reaches a second number.

26. A method according to claim 24, wherein the at least one first control signal includes a first control signal and a second control signal; and further comprising:
    performing a second logic function using a second logic gate having a first input for receiving the first control signal, a second input for receiving the second control signal, and an output for providing the validation signal; and
    performing a third logic function using a third logic gate having a first input for receiving the sampled signal, a second input for receiving the second control signal, and an output for providing a second sampled control signal.

27. A method according to claim 24, wherein the sampling signal is the output signal.

28. A method according to claim 24, wherein a period of the sampling signal is less than or equal to the desired period of the output signal.

* * * * *

UNITED STATES PATENT AND TRADEMARK OFFICE
CERTIFICATE OF CORRECTION

PATENT NO. : 6,680,633 B2  
DATED : Jnuary 20, 2004  
INVENTOR(S) : Gailhard et al.

It is certified that error appears in the above-identified patent and that said Letters Patent is hereby corrected as shown below:

Column 2,  
Line 34, delete, "$CKHF_{13}N$" insert -- $CKHF\_N$ --  
Line 44, delete, "(instants t5 in t7 in FIGS. 2a-2d)" insert -- (instants t5 and t7 in FIGS. 2a-2d) --  
Line 64, delete, "FHF0 . The" insert -- FHF0. The --

Column 6,  
Line 24, delete, "Val" insert -- VAL --

Column 9,  
Line 31, delete, "receiving receive" insert -- receiving --

Column 10,  
Line 66, delete, "receiving receive" insert -- receiving --

Signed and Sealed this

Fifteenth Day of June, 2004

JON W. DUDAS  
*Acting Director of the United States Patent and Trademark Office*